(12) United States Patent
Suto

(10) Patent No.: US 6,504,876 B1
(45) Date of Patent: Jan. 7, 2003

(54) PULSE SIGNAL GENERATING APPARATUS AND PULSE SIGNAL GENERATING METHOD

(75) Inventor: Shinichi Suto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/391,372

(22) Filed: Sep. 8, 1999

(30) Foreign Application Priority Data

Sep. 17, 1998 (JP) .......................... 10-263073

(51) Int. Cl.[7] ................................ H03K 3/00
(52) U.S. Cl. ...................... 375/259; 375/295; 327/291; 307/106
(58) Field of Search ................. 375/238, 239, 375/256, 259, 295; 377/1, 2, 26, 27, 56, 64; 327/291; 307/106

(56) References Cited

U.S. PATENT DOCUMENTS

| | | | | |
|---|---|---|---|---|
| 3,632,876 A | * | 1/1972 | Bench ....................... | 178/67.1 |
| 4,159,873 A | * | 7/1979 | Farnsworth ................. | 327/197 |
| 4,160,237 A | * | 7/1979 | McMahon .................. | 356/365 |
| 4,250,401 A | * | 2/1981 | Sumida ....................... | 377/26 |

FOREIGN PATENT DOCUMENTS

| | | |
|---|---|---|
| JP | 63-156424 | 6/1988 |
| JP | 2-199503 | 8/1990 |
| JP | 8-76875 | 3/1996 |
| JP | 8-162933 | 6/1996 |
| JP | 9-145783 | 6/1997 |
| JP | 2773546 | 4/1998 |

OTHER PUBLICATIONS

Japanese Office Action, dated Jul. 26, 2001, with English language translation of Japanese Examiner's comments.

* cited by examiner

Primary Examiner—Amanda T. Le
(74) Attorney, Agent, or Firm—Whitham, Curtis & Christofferson, PC

(57) ABSTRACT

The pulse signal generating apparatus includes a control circuit, a shift register, a counter and a processor. The control circuit generates a trigger signal to trigger a transition of a signal level. The shift register to which level data to define a signal level is set and in which the level data is serially shifted in response to the trigger signal from the control circuit to generate a pulse signal. The pulse signal is generated based on data shifted out from the shift register. The counter increments a content according to the trigger signal from the control circuit to generate an interruption signal every time the content reaches a predetermined value. The processor sets the level data in the shift register in response to the interruption signal from the counter.

10 Claims, 4 Drawing Sheets

PULSE SIGNAL GENERATING APPARATUS AND PULSE SIGNAL GENERATING METHOD

BACKGROUND OF THE INVENTION

1. Field of the Invention

The present invention relates to a pulse signal generating apparatus and a pulse signal generating method, and more specifically, to a technique capable of producing a desired pulse signal under a program control.

2. Description of the Related Art

Conventionally, in a microcomputer application apparatus such as a video player, an audio player, various type of pulse signal generating apparatuses are used to control the operation of the apparatus. Such a pulse signal generating apparatus is well known in which a pulse signal having an, optional waveform can be generated under a program control.

FIG. 1 shows a blockidiagram of one example of such a conventional pulse signal generating apparatus. This pulse signal generating apparatus is composed of a timer 50, a comparator 51 with a register (will be simply referred to as a "comparator 51" hereinafter), a buffer 52, a latch 53, a port 54 and a central processing unit (will be simply referred to as a "CPU" hereinafter) 55. The timer 50 is composed of a counter that the content is incremented at every predetermined time interval. A timer count value outputted from this timer 50 is supplied to a comparator 51.

The comparator 51 is composed of a register and a comparator (illustrating neither). A timing data from the CPU 55 is set in the register. This timing data is used to determine a transition timing of a pulse signal to be generated. The comparator compares the timing data in the register and the timer count value outputted from the timer 50, and outputs a coincidence signal when the timing data in the register coincides with the timer count value outputted from the timer 50. The coincidence signal outputted from this comparator 51 is supplied to the buffer 52, and is also supplied to the CPU 55 as an interruption signal.

The buffer 52 stores a level data sent from the CPU 55. The level data is used to determine the level of the pulse signal to be generated in this pulse signal generating apparatus. The level data stored in this buffer 52 is transferred to the latch 53 when the coincidence signal is supplied from the comparator 51. The latch 53 holds the level data until a new level data is supplied from the buffer 52. The content of this latch 53 is send to a external device (not shown) through the port 54.

Subsequently, an operation of the conventional pulse signal generating apparatus with employment of the above-explained arrangement will now be described with reference to the explanatory diagram shown in FIG. 2.

First, the CPU 55 sets a timing data $TD_1$ into the register included in the comparator 51 and sets "1" as level data into the buffer 52. In this condition, the timer 50 begins a counting operation. Then, when the data outputted from the timer 50 coincidences with the timing data $TD_1$ stored in the comparator 51, the comparator 51 outputs an coincidence signal.

As a result, the level data of "1" stored in the buffer 52 is transferred to the latch 53. Through above operations, the level of the pulse signal outputted from the port 54 becomes a high level (hereinafter, is called "H level") at timing $T_1$. Also, the coincidence signal outputted from the comparator 51 is supplied to the CPU 55 as the interruption signal. In response to this interruption signal, the CPU 55 sets a timing data $TD_2$ in the comparator 51 and also sets level data of "0" in the buffer 52. In this condition, the counting operation of the timer 50 is continuously executed, and when the data outputted from the timer 50 coincidences with the timing data $TD_2$ stored in the comparator 51, the comparator 51 outputs an coincidence signal.

As a result, the level data of "0" in the buffer 52 is transferred to the latch 53. Through above operations, the level of the pulse signal outputted from the port 54 becomes a low level (hereinafter, is called "L level") at timing $T_2$. Also, the coincidence signal outputted from the comparator 51 is supplied to the CPU 55 as an interruption signal. In response to this interruption signal, the CPU 55 sets a timing data $TD_3$ in the comparator 51 and also sets level data of "1" in the buffer 52. Subsequently, while operations similar to the above operations are repeatedly carried out, such a pulse signal as shown in FIG. 2 is generated.

According to this conventional pulse signal generating apparatus, because the timing data to be set in the comparator 51 and the level data to be set in the buffer 52 are suitably changed into, the pulse signal having a desired waveform (pulse width) can be generated.

As a related conventional technology, Japanese Laid Open Patent Disclosure (JP-A-Heisei 2-199503) discloses "A MICROCOMPUTER". This microcomputer equips a memory which stores at least one of the program and the data, a central processing unit which executes calculation processing in accordance, with the program stored in the memory, and a pulse producing circuit which generates a pulse signal based on the data set from this central processing unit and outputs the pulse signal. The pulse producing circuit of this microcomputer equips with a counter, a comparator with a plurality of registers, a first pulse output circuit, an arbitration circuit, a second pulse output circuit and a selection circuit.

The content of the counter is renewed based on the externally supplied clock. The comparator with the plurality of registers compares the data set from the central processing unit and the content of the counter, and when the data set from the central processing unit coincidences with the content of the counter, outputs a coincidence signal. The first pulse output circuit is set/reset in response to the coincidence signal outputted from the comparator with the plurality of registers and externally outputs a first output pulse. The arbitration circuit arbitrates the coincidence signals outputted from a part of the comparator with the plurality of registers based on the fixed priority, and then outputs a reading signal for reading data to the other part of the comparator with the plurality of registers. The second pulse output circuit outputs the data read from the comparator with the registers by using the reading signal supplied from the arbitration circuit to outside as the second signal pulse. The selection circuit makes either of the first and the second pulse output circuit operate.

According to this microcomputer, when the data that defines the rising time and the falling time of each phase is stored in the comparator with the plurality of registers, the comparator with the plurality of registers compares the stored data and the content of the counter. Then, the first pulse output circuit is set/reset by the coincidence signal outputted from the comparator with the plurality of register. As a result, such a PWM pulses signal that the conventional microcomputer generates is obtained. Also, if the output timing data which shows the output time of the data is stored into a part of the comparator with the plurality of registers and data to be outputted is stored in another part of the comparator with the plurality of registers, so-called real-time processing to output desired data in the desired timing can be performed. In this case, when the same output timing data is stored in the comparator with the plurality of registers, the arbitration circuit arbitrates these timing based on predetermined priority. As a result, the conflict among the data can be prevented.

Also, Japanese Laid Open Patent Disclosure (JP-A-Heisei 8-76875) discloses "MICROCOMPUTER APPLICATION SYSTEM". In this microcomputer application system, a counter is cleared when the write pulse detecting station detects a write cycle signal of the CPU. Then, the content of the counter is compared with the content of the control register at a comparator, and an idle state signal is outputted from the state detection signal output section in case of the coincidence. As a result, when the CPU is in the idle state, a current clock is switched to the half degree of the rating and is supplied to the peripheral circuits. When cash miss-hit is detected, an idle state cancellation signal is outputted from the state detection signal output section. As a consequently, the idle state is stopped, and the current clock is changed to the rating clock and is supplied to the peripheral circuit.

According to this microcomputer application system, when the CPU is in the idle state, because the peripheral circuit operates at the low clock frequency, a consumption power of the peripheral circuit can be suppressed.

Also, Japanese Laid,Open Patent Disclosure (JP-A-Heisei 9-145783) discloses "IC TEST APPARATUS". This IC test apparatus is provided with a timer unit to generate a timing signal to apply the signal for the test which is sent from the tester controller to the test unit to the test head and to output the generated timing signal to the external appliance. Also, this IC test apparatus is provided with a counter,ia register and a coincidence circuit. The counter counts the timing pulse inputted into the test unit from the timer unit. The register stores the timing information that applies a signal for the test to the test head. The coincidence circuit compares the timing information stored in the register and the content of the counter and outputs the signal for the test to the test head in case of the coincidence.

According to this IC test apparatus, the producing of the signal for the test is not performed by the interruption to the CPU from the timer. As a result, the degradation of the time precision, which is caused by the software processing, and the increase of the load of the CPU are prevented.

Moreover, Japanese Patent NO. 2773546 discloses "PULSE GENERATING CIRCUIT". This pulse generating circuit is provided with selection means, a timer, a first comparator with a register and a second comparator with a register. The selection means selects either of an external event signal and a time signal. The timer calculates the length of the signal selected by the selection means. The first comparator with the register and the second comparator with the register store a predetermined value respectively, and compare this stored predetermined value with the count value outputted from the timer, and then output a coincidence signal when a coincidence of the predetermined value and the count value is occurred. At this pulse generating circuit, the length of the external event signal is calculated by the timer and when a coincidence of the count value in the timer with the predetermined value is occurred, an coincidence signal is outputted from the first comparator with register. The selection means select the time signal according to this coincidence signal, then the length of this time signal is calculated by the timer. This count value in the timer is compared with the predetermined value in the comparator with second register and coincidence is detected According to this pulse generating circuit, by switching the count clock inputted to the timer based on the coincidence signal outputted from the comparator with register, the differing count clocks such as the time signal and the external event signal can be intermingled with one piece of pulse output. As a result, hardware quantity is reduced and the load of the software processing is reduced.

However, in the above mentioned conventional pulse signal occurrence apparatus, the CPU 55 must set timing data in the comparator 51 and set level data in the buffer 52 respectively every time the timing to change a waveform is arrived. As a result, when the pulse signal where much change of the output level occurs is generated, the interruption frequently occurs and the load of the CPU 55 becomes heavy. Especially, at the microcomputer for the video apparatus having a software servo function, the performance of the software servo degrades because the interruption occurs frequently.

Incidentally, according to the microcomputer disclosed in the above Japanese Laid Open Patent Disclosure (JP-A-Heisei 2-199503), the pulse signal can be generated under the programmable control. However, when the pulse signal where much change of the output level occurs is generate, the load of the CPU can not be reduced because the number of times to set data in the comparator with register must be increased like the conventional pulse signal generating apparatus shown in FIG. 1.

Also, according to the microcomputer application system disclosed in the Japanese Laid Open Patent Disclosure (JP-A-Heisei 8-76875), one of the clocks which is selected from two kinds of clocks, each of which has an different frequency each other, by whether or not the CPU is an idle state can be supplied to the peripheral circuit. However, the technique disclosed in this microcomputer application system, the optional pulse signal can not be genera ed and also the load of the CPU can not be reduced.

Also, the IC test apparatus disclosed in the Japanese Laid Open Patent Disclosure (JP-A-Heisei 9-145783) is the technique for controlling the timing to output a pulse signal but is not the technique for producing pulse signal. As a result, the optional pulse signal can not be generated.

Moreover, at the pulse generating circuit shown in the Japanese Patent NO. 2773546, like the pulse signal generating apparatus described by referring to FIG. 1, the CPU must set data in the comparator with register in response to the interruption generated every time the timing to change a pulse is arrived. Since when the pulse signal where much change of the output level occurs is generated, the interruption occurs frequently, such a problem that the load of the CPU 55 becomes heavy is not canceled.

SUMMARY OF THE INVENTION

Therefore, the present invention has an object to provide an pulse signal generating apparatus and a pulse signal generating method capable of producing a pulse signal having an optional waveform, and moreover, capable of reducing the load of the processor.

To achieve the above-described object, pulse signal generating apparatus, according to a first aspect of the present invention, includes a control circuit, a shift register, a counter and a processor. The control circuit generates a trigger signal to trigger a transition of a signal level. The shift register to which level data to define a signal level is set and in which the level data is serially shifted in response to the trigger signal from the control circuit to generate a pulse signal. The pulse signal is generated based on data shifted out from the shift register. The counter increments a content according to the trigger signal from the control circuit to generate an interruption signal every time the content reaches a predetermined value. The processor sets the level data in the shift register in response to the interruption signal from the counter.

In the pulse signal generating apparatus according to the first aspect, the control circuit includes a timer, n (n is equal to or more than 2 integer) comparators and a gating circuit. A content of the timer is incremented at every predetermined time interval. Each of the n comparators is provided with a register to store a timing data to define a transition timing of the signal level, and each comparator compares the timing data with the content of the timer to output an coincidence signal when the timing data coincides with the content of the timer. The gating circuit generates the trigger signal when the coincidence signal is generated from either of the n comparators. In this structure, the counter generates the interruption signal every time the content of the timer reaches a value of n.

Also, in this pulse signal generating apparatus, the timing data, which is set in the register, is supplied from the processor. Furthermore, the timer is composed of a programmable timer in which data to define the predetermined time interval is set from the processor.

Similarly, to achieve the above-described object, a pulse signal generating method, according to a second aspect of the present invention, includes steps of producing a trigger signal to trigger a transition of a signal level, shifting a level data to define the signal level in response to in the trigger signal serially, generating a pulse signal based on a data which is shifted out at the shifting step, incrementing a count value according to the trigger signal to generate an interruption signal every time the count value reaches a predetermined value; and initializing the level data in response to the interruption signal.

In the pulse signal generating apparatus according to the second aspect, the step of producing the trigger signal comprises the steps of incrementing a timer count value at every predetermined time interval, comparing each of n (n is equal to or more than 2 integer) timing data to define a transition timing of the signal level and the timer count value and producing the trigger signal when the timer count value coincides with either of the timing data.

Also, in this pulse signal generating method, the n timing data are supplied from a processor. Furthermore, the predetermined time interval of incrementing the timer count value is determined based on data supplied from a processor.

BRIEFED DESCRIPTION OF THE DRAWINGS

For a better understanding of the present invention, reference is made of a detailed description to be read in conjunction with the accompanying drawings, in which.

DESCRIPTION OF THE PREFERRED EMBODIMENTS

Referring now to drawings, a description is made of a pulse signal generating apparatus and also a pulse signal generating method, according to a preferred embodiment of the present invention in, detail.

Figure 1:
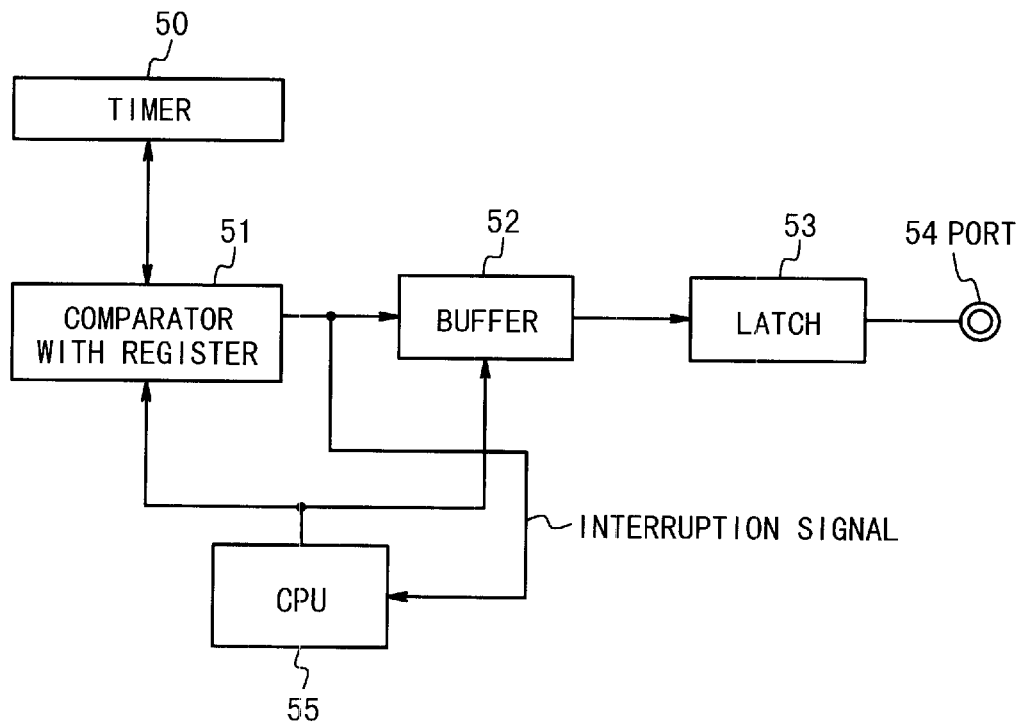
FIG. 1 is a schematic block diagram for showing an example of a conventional pulse signal generating apparatus.
Figure 2:
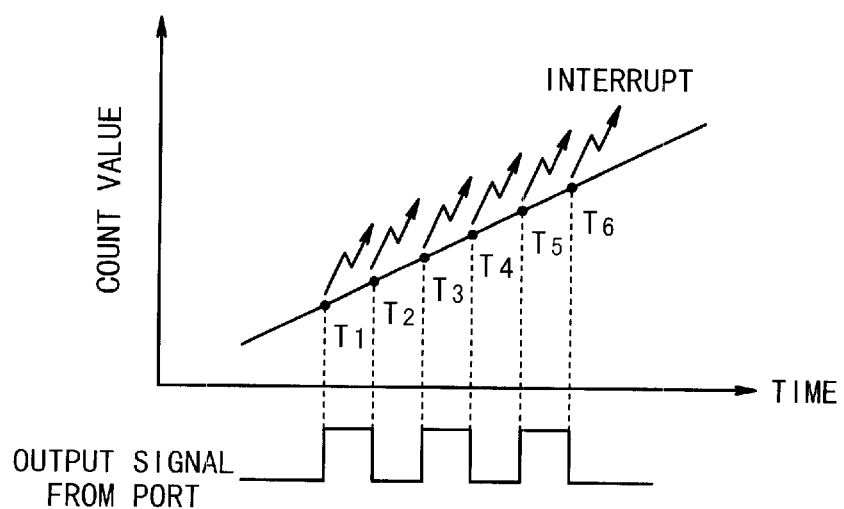
FIG. 2 is an explanatory diagram for explaining an operation of the conventional pulse signal generating apparatus.
Figure 3:
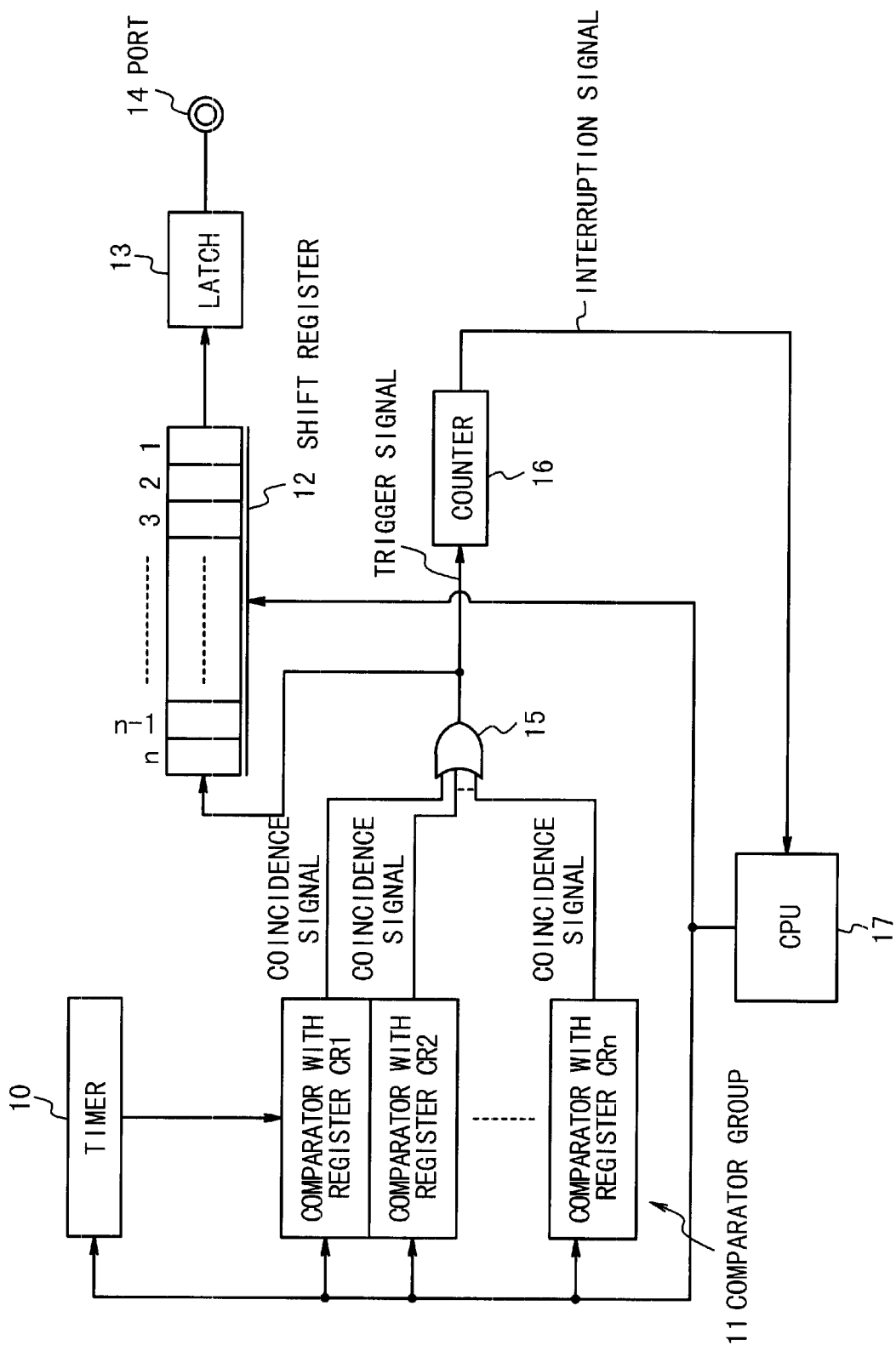
FIG. 3 is a schematic block diagram for representing a structure of a pulse signal generating apparatus according to an embodiment of the present invention.

FIG. 3 is a schematic block diagram for showing the structure of a pulse signal generating apparatus according to the present invention. This pulse signal generating apparatus is composed of a timer 10, a comparator group 11, a shift register 12, a latch 13, a port 14, an OR gate 15 and a counter 16. The comparator group 11 is composed of 1n comparators CR1–CRn, each of which is provided with a register. This pulse signal generating apparatus is controlled by a CPU 17 (will be discussed more in detail later).

The timer 10 is composed of a counter which is increased every predetermined time interval. The CPU 17 sets an initial value to this timer 10. Also, the timer 10 supplies a count value to each of the comparators CR1–CRn. A programmable timer may be employed as this timer 10 in which an increase interval is determined according to a data set by the CPU 17. Because the precision of the pulse signal can be optionally adjusted by employing the programmable timer, the application range of this pulse signal generating apparatus will be spread.

Figure 4:
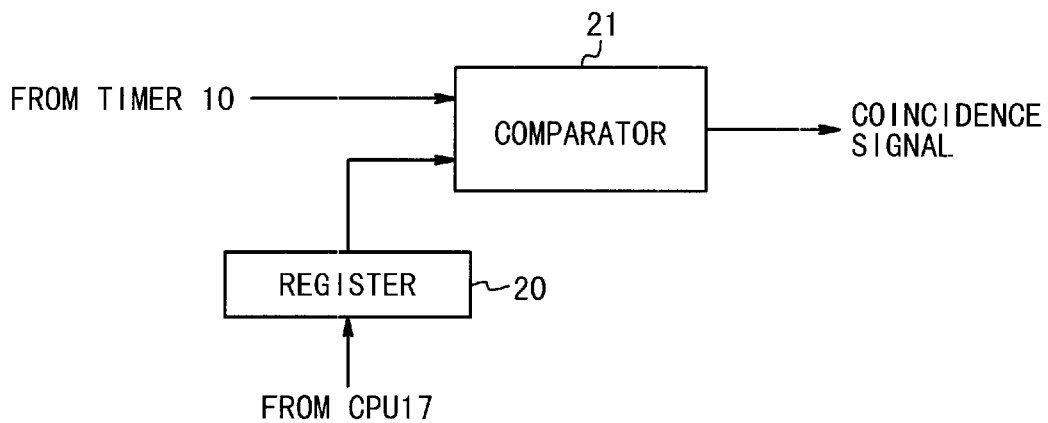
FIG. 4 is a block diagram for showing a structure of each comparator with register shown in FIG. 3.

Each of the comparators CR1–CRn contained in the comparator group 11 is composed of a register 20 and a comparator 21 as shown in FIG. 4. The CPU 17 sets a timing data in the register 20. The timing data defines timings for the pulse signal to be changed in level. Also, the comparator 21 compares the timing data stored in the register 20 and a count value outputted from the timer 10, and outputs a coincidence signal when the timing data coincides with the count value. The coincidence signal outputted from each of the comparators CR1–CRn is supplied to the OR gate 15.

The OR gate 15 performs an logical OR operation to the coincidence signals from the comparators CR1–CRn and supplies a signal obtained as the result of the logical OR operation to the shift register 12 and the counter 16 as a trigger signal. The trigger signal outputted from the OR gate 15 is used in the shift register 12 as a shift clock and is used at the counter 16 as a count clock.

The shift register 12 is composed of an n-bit shift register having a function of parallel input-serial output. Each of bits 1n of this shift register 12 corresponds to each of the comparators CR1–CRn, respectively. This shift register 12 stores the level data sent from the CPU 17 as a parallel data. The level data defines the level (the H level or the L level) of the pulse signal to be generated in this pulse signal generating apparatus.

The content of the shift register 12 is shifted to the right direction every time the trigger signal outputted from the OR gate 15 is activated. In other words, the content of the shift register 12 is shifted to the right direction every time the coincidence signal is outputted from either of the comparators CR1–CRn. The level data shifted out by this shift register 12 is supplied to the latch 13.

The latch 13 holds the level data shifted out by the shift register 12 until a next level data is shifted out by the shift register 121. The output signal from this latch 13 is supplied to an external device (not shown) through the port 14.

The counter 16 is composed of a modulo n counter. The content of this counter 16 is increased each time the trigger signal outputted from OR gate 15 is applied as a count clock. This counter 16 outputs a carry signal when the content of the counter 16 is rounded from n to zero and supplies the carry signal to the CPU 17 as an interruption signal. That is, the content of the counter 16 is incremented every time the coincidence signal is outputted from either of the comparators CR1–CRn. When the content of the counter 16 reaches n, an interruption to the CPU 17 occurs.

The CPU 17 executes interruption processing when a interruption signal is activated. In this interruption processing, a timing data corresponding to a pulse signal to be generated is set into each of the comparators CR1–CRn, also level data islet into the shift register 12. It should be noted that in such a case that the timer 10 is composed of the programmable timer, the CPU 17 sets a data to define an increased interval in the timer 10.

Figure 5:
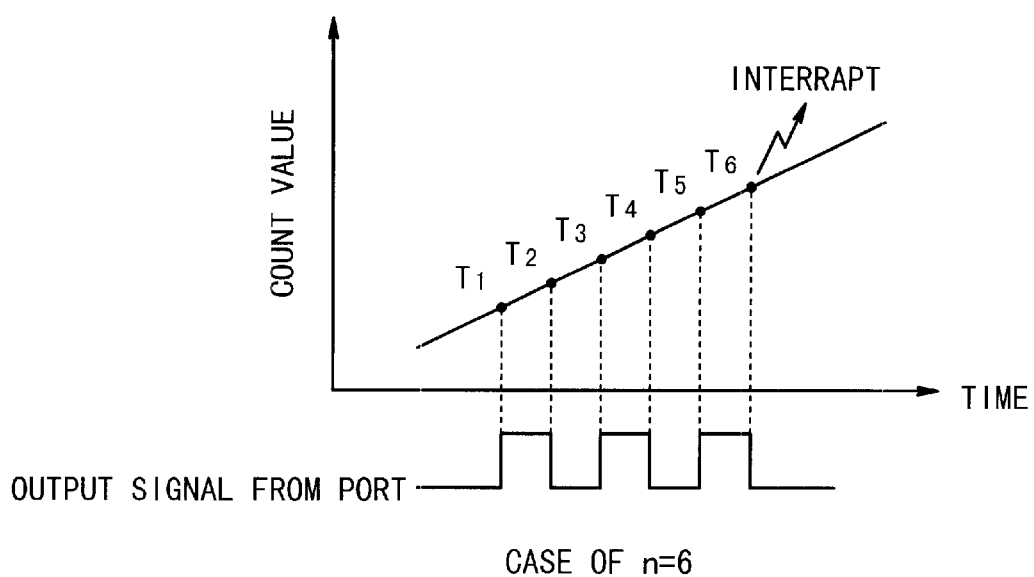
FIG. 5 is a explanatory diagram for explaining an operation of the pulse signal generating apparatus according to the embodiment of the present invention.
Figure 6:
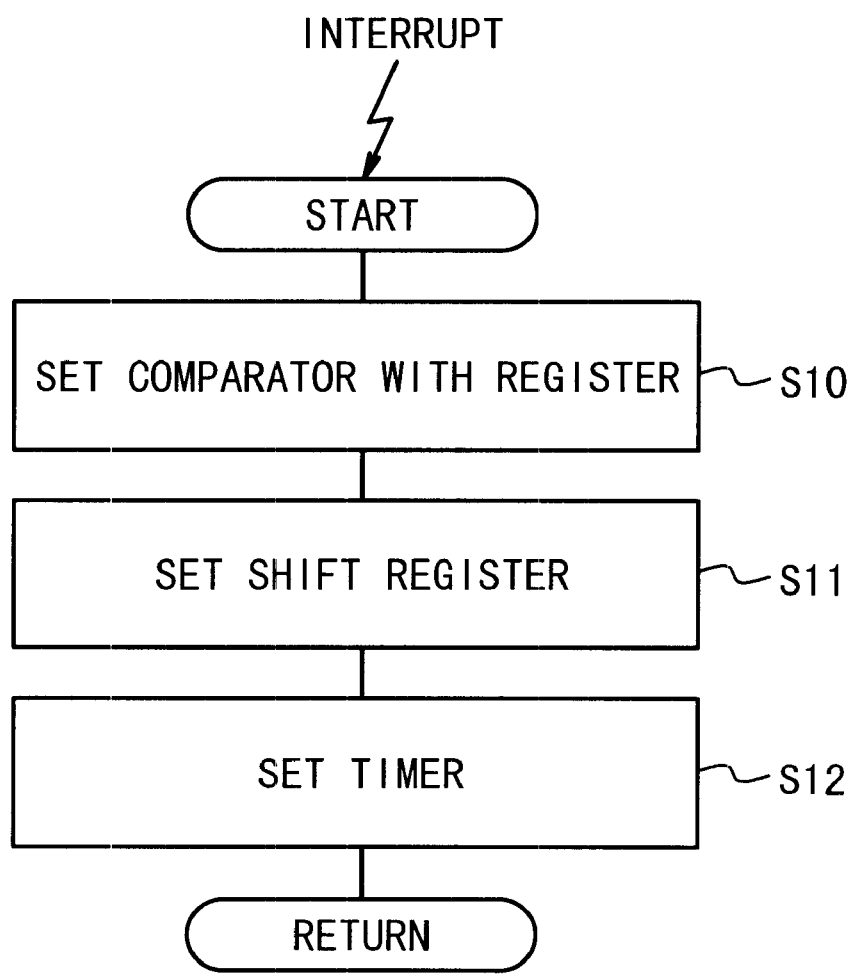
FIG. 6 is a flow chart for describing an operation of the CPU that controls the pulse signal generating apparatus according to the embodiment of the present invention.

Next, referring now to FIG. 5 and FIG. 6, the operation of the pulse signal generating apparatus with employment of above-explained arrangement will be described in detail. It is now assumed that n=6 and the content of the counter 16 is cleared to 0 in the initial state. In this case, the counter 16 is composed of a modulo 6 counter.

First, the CPU 17 sets an initial value to the timer 10. Also, the CPU 17 sets the timing data $TD_1$ to $TD_6$ in the comparators CR1 to CR6, respectively. Each timing data has a relationship of "$TD_1<TD_2<TD_3 TD_4<<TD_5<TD_6$". Also, the CPU 17 sets 6-bit level data "101010B" into the shift register 12. It should be noted that the last digit "B" of the level data indicates that a preceding numeral value is represented in binary.

When the above processing is completed, the increment of the content of the timer 10 is started. When a coincidence of the count value outputted from the timer 10 and the timing data $TD_1$ stored in the comparator CR1 occurs by this increment, the comparator CR1 outputs an coincidence signal. This coincidence signal is supplied to the shift register 12 and the counter 16 via the OR gate 15.

As a result, the level data stored in the shift register 12 is shifted into the right direction by 1 bit. The level data of "1" shifted out from the shift register 12 through this shift operation is latched in the latch 13. As a result, as shown in FIG. 5, the level of the signal outputted from the port 14 changes to the H level at the timing $T_1$. Also, the content of the counter 16 is incremented according to, the trigger signal outputted from the OR gate 15 to thereby change to "1".

The counting operation of the timer 10 progresses from this state and then when the coincidence of the count value outputted from the timer 10 and the timing data $TD_2$ stored in the comparator CR2 occurs, the comparator CR2 outputs a in coincidence signal. This coincidence signal is supplied to the shift register 12 and the counter 16 via the OR gate 15.

As a result, the level data stored in the shift register 12 is shifted into the right direction by 1 bit. The level data of "0" shifted out from the shift register 12 through this shift operation is latched in the latch 13. As a result, as shown in FIG. 5, the level of the signal outputted from the port 14 changes to the L level at the timing $T_2$. Also, the content of the counter 16 is incremented according to the trigger signal outputted from the OR gate 15 to thereby change to "2".

Subsequently, since the coincidence of the count value outputted from the timer 10 and the timing data $TD_3$ stored in the comparators CR3 occurs in the similar manner, the level data stored in the shift register 12 is sequentially shifted to the right direction. As a result, as shown in FIG. 5, a level of the signal which is outputted from the port 14 is altered to the H level at timing $T_3$, is altered to the L level at timing $T_4$, and is altered to the H level a timing $T_5$, respectively. Also, the content of the counter 16 is sequentially incremented according to the trigger signal outputted from the OR gate 15 to thereby change to "5".

The counting operation of the timer 10 progresses from this state and when the coincidence of the count value outputted from the timer 10 and the timing data $TD_6$ stored in the comparator CR6 occurs, the comparator CR6 outputs an coincidence signal. This coincidence signal is supplied to the shift register 12 and the counter 16 via the OR gate 15.

As a result, the level data stored in the shift register 12 is shifted into the right direction by 1 bit. The level data of "0" shifted out from the shift register 12 through this shift operation is latched in the latch 13. As a result, as shown in FIG. 5, the level of the signal outputted from thee port 14 changes to the L level at the timing $T_6$. Also, the content of the counter 16 is incremented according to the trigger signal outputted from the OR gate 15 to thereby return to "0". At this time, a carry signal is outputted from the counter 16. This carry signal is supplied to the CPU 17 as the interruption signal. The CPU 17 executes the interruption processing shown in the flow chart of FIG. 6 in response to the interruption signal.

In this interruption processing, first, new timing data $TD_1$–$TD_6$ are set into the comparators CR1–CR6, respectively (Step S10), and new level data is set into the shift register 12 (Step S11). Next, an initial value is set to the timer 10 (Step S12). After that, the sequence operation of the CPU 17 is returned to the interrupted position. As a consequence, the producing of a pulse signal is resumed based on new timing data $TD_1$–$TD_6$ and new level data. An operation after this time is the same as the above-mentioned operation.

In the above explanation, the level data "101010B" where "1" and "0" are appeared alternately is used but the level data where "1", or "0" is appeared continuously can be used. In this case, the width of the H level of the pulse signal or the width of the L level can be made long. Incidentally, the width of the H level of the pulse signal or the width of the L level can be adjusted by the timing data $TD_1$–$TD_6$ to be set in the comparators CR1–CR6.

According to the pulse signal generating apparatus described above, because the interruption occurs once every time the level of the pulse signal changes in the n time, the load of the CPU 17 can be reduced. This fact means that the change speed of the pulse signal generated in the pulse signal generating apparatus according to this embodiment can be n times faster than the change speed of the pulse signal generated in the conventional pulse signal generating apparatus if the performance of the CPU 17 is identical with the conventional CPU.

As previously described in detail, in accordance with the pulse signal generating apparatus/method of the present invention, the pulse signal that has an optional waveform can be generated. Moreover, such a pulse signal generating apparatus/method, capable of reducing the load of the processor can be provided.

What is claimed is:

1. A pulse signal generating apparatus comprising:
    a control circuit which generates a trigger signal to trigger a transition of a signal level;
    a shift register having n bits to which level data to define a signal level is set and in which said level data is serially shifted in response to the trigger signal from said control circuit to generate a pulse signal, wherein the pulse signal is generated based on data shifted out from said shift register;

a counter which increments a content of said counter according to said trigger signal from said control circuit to generate an interruption signal every time the content reaches a predetermined value, said predetermined value being n; and a processor which sets said level data in said shift register in response to the interruption signal from said counter, wherein said trigger signal is used as a shift clock for said shift register and as a count clock for said counter, and wherein said predetermined value n is an integer greater than or equal to 2.

2. A pulse signal generating apparatus, comprising:

a control circuit which generates a trigger signal to trigger a transition of a signal level;

a shift register to which level data to define a signal level is set and in which said level data is serially shifted in response to the trigger signal from said control circuit to generate a pulse signal, wherein the pulse signal is generated based on data shifted out from said shift register;

a counter which increments a content of said counter according to said trigger signal from said control circuit to generate an interruption signal every time the content reaches a predetermined value; and a processor which sets said level data in said shift register in response to the interruption signal from said counter, wherein said control circuit includes a timer which increments a content of said timer at every predetermined time interval;

n (n is an integer equal to or more than 2) comparators each of which is provided with a register to store a timing data to define a transition timing of said signal level, wherein each comparator compares the timing data with the content of said timer to output a coincidence signal when said timing data coincides with the content of said timer; and a gating circuit which generates said trigger signal when the coincidence signal is generated from either of said n comparators, and wherein said counter generates said interruption signal every time the content of said timer reaches a value of n.

3. A pulse signal generating apparatus according to claim 2, wherein said timing data, which is set in said register, is supplied from said processor.

4. A pulse signal generating apparatus according to claim 2, wherein said timer is composed of a programmable time in which data to define said predetermined time interval is set from said processor.

5. A pulse signal generating apparatus according to claim 4, wherein said timing data, which is set in said register, is supplied from said processor.

6. A pulse signal generating method comprising:

producing a trigger signal to trigger a transition of a signal level;

shifting a level data serially to define said signal level in response to said trigger signal, said level data having n bits and being loaded in parallel;

generating a pulse signal based on a data which is shifted out at said shifting step;

incrementing a count value according to said trigger signal to generate an interruption signal every time the count value reaches a predetermined value, said predetermined value being n; and initializing said level data in response to said interruption signal, wherein said trigger signal is used as a shift clock for said shifting step and as a counter clock for said incrementing step, and wherein said predetermined value n is an integer equal to or greater than 2.

7. A pulse signal generating method, comprising:

producing a trigger signal to trigger a transition of a signal level;

shifting a level data serially to define said signal level in response to said trigger signal;

generating a pulse signal based on a data which is shifted out at said shifting step;

incrementing a count value according to said trigger signal to generate an interruption signal every time the count value reaches a predetermined value; and initializing said level data in response to said interruption signal, wherein said step of producing the trigger signal includes
incrementing a timer count value at every predetermined time interval;
comparing each of n (n is an integer equal to or more than 2) timing data to define a transition timing of said signal level and said timer count value; and
producing said trigger signal when said timer count value coincides with either of said timing data.

8. A pulse signal generating method according to claim 7, wherein said n timing data are supplied from a processor.

9. A pulse signal generating method according to claim 7, wherein said predetermined time interval of incrementing said timer count value is determined based on data supplied from a processor.

10. A pulse signal generating method according to claim 9, wherein said n timing data are supplied from said processor.

* * * * *